United States Patent
Lee

(10) Patent No.: US 7,227,250 B2
(45) Date of Patent: Jun. 5, 2007

(54) BALL GRID ARRAY SUBSTRATE HAVING WINDOW AND METHOD OF FABRICATING SAME

(75) Inventor: Jong Jin Lee, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/093,979

(22) Filed: Mar. 30, 2005

(65) Prior Publication Data
US 2006/0131729 A1    Jun. 22, 2006

(30) Foreign Application Priority Data
Dec. 17, 2004    (KR) ...................... 10-2004-0108179

(51) Int. Cl.
*H01L 23/02* (2006.01)
(52) U.S. Cl. ...................................... 257/686; 257/700
(58) Field of Classification Search ................ 257/700, 257/782, 787, 686–687
See application file for complete search history.

(56) References Cited

U.S. PATENT DOCUMENTS

| | | | |
|---|---|---|---|
| 5,696,666 A | 12/1997 | Miles | |
| 6,180,881 B1 * | 1/2001 | Isaak | ........................... 174/524 |
| 6,982,488 B2 * | 1/2006 | Shin et al. | ................... 257/777 |

FOREIGN PATENT DOCUMENTS

| JP | 11-135560 | 5/1999 |
|---|---|---|
| JP | 2001-189403 A | 7/2001 |

OTHER PUBLICATIONS

Abstract of Laid-Open Patent Gazette for Korean Patent No. 344,618 issued Jul. 5, 2002.

* cited by examiner

*Primary Examiner*—Theresa T. Doan
(74) *Attorney, Agent, or Firm*—Darby & Darby

(57) ABSTRACT

Disclosed is a ball grid array substrate having a window formed on a core material instead of a thin core material, and wherein a semiconductor chip is mounted thereon, thereby reducing the thickness of a package, and a method of fabricating the same. The ball grid array substrate comprises a first external layer which includes first circuit patterns, wire bonding pad patterns, and a window corresponding in size to a first chip mounted therein and wherein the chip is wire-bonded to the wire bonding pad patterns. A second external layer includes second circuit patterns, a portion corresponding in position to the window of the first external layer, and solder ball pad patterns. Second chips mounted on the solder ball pad patterns. An insulating layer interposed between the first and second external layers. The window is formed through the insulating layer at a position corresponding to the window of the first external layer.

7 Claims, 10 Drawing Sheets

- 104a
- 103a
- 102a
- 101
- 102b
- 103b
- 104b

- 103a
- 102a
- 101
- 102b
- 103b

- 105a
- 103a
- 102a
- 101
- 102b
- 103b
- 105b

BALL GRID ARRAY SUBSTRATE HAVING WINDOW AND METHOD OF FABRICATING SAME

INCORPORATION BY REFERENCE

The present application claims priority under 35 U.S.C. §119 to Korean Patent Application No. 2004-108179 filed on Dec. 17, 2004. The content of the application is incorporated herein by reference in its entirety.

BACKGROUND OF THE INVENTION

1. Field of the Invention

The present invention relates, in general, to a ball grid array substrate and a method of fabricating the same and, more particularly, to a ball grid array substrate having a window, in which the window is formed on a core material instead of using a thin core material, and in which a semiconductor chip is mounted thereon, thereby reducing the thickness of a package, and a method of fabricating the same.

2. Description of the Prior Art

In accordance with the recent trend toward a light, slim, short, and miniaturized package for semiconductor chips, a thickness of the package for semiconductor chips has been gradually reduced. Additionally, reduction of the thickness of a ball grid array substrate, on which the semiconductor chips are mounted, is needed.

Having been developed to satisfy the demand for highly integrated semiconductor chips and multiple pins, a ball grid array package belongs to an SMT-type package (surface mounting technology) which includes a plurality of conductive balls, for example, solder balls, arranged in a predetermined form on a lower side of a main board so as to be mounted on the main board.

In the ball grid array as described above, the solder balls on the ball grid array substrate are electrically attached to conductive connection patterns of a printed circuit board so as to achieve the mounting. The ball grid array is an SMT-type package in which soldering balls are arrayed instead of a lead on a backside of the printed circuit board. The ball grid array is a semiconductor chip, in which a highly integrated circuit (LSI) chip is mounted on a surface of a printed circuit board and the resulting board is sealed using a mold resin or a pot, and put in a package for multiple pin LSIs having 200 or more pins. This is also called PAC (pad array carrier), and is advantageous in that it is possible to fabricate a main body of the package so that the main body is smaller than a QFP (quad flat package) which is provided with L-shaped lead pins protruding from four sides thereof.

Accordingly, with respect to recent packages, such as MCMs (multi-chip packages) and SIPs (system in packages), on which semiconductor chips are stacked, a thin core material is used to make a ball grid array substrate slim.

FIGS. 1a to 1j are sectional views illustrating the fabrication of a ball grid array substrate according to an embodiment of a conventional technology.

As shown in FIG. 1a, a copper clad laminate (CCL), which includes an insulating resin layer 101 and copper foils 102a, 102b on both sides of the insulating resin layer, is prepared as a substrate 100.

As shown in FIG. 1b, via holes (A) are formed to connect circuits of the upper and lower copper foils 102a, 102b of the substrate 100 to each other.

As shown in FIG. 1c, copper plating layers 103a, 103b are formed on the upper and lower copper foils 102a, 102b of the substrate 100 and on walls of the via holes (A) so as to electrically connect the via holes (A).

As shown in FIG. 1d, dry films 104a, 104b are layered on the upper and lower copper plating layers 103a, 103b of the substrate 100.

As shown in FIG. 1e, the dry films 104a, 104b having a predetermined pattern are exposed and developed. The predetermined pattern includes a circuit pattern, lands of the via holes (A), a wire bonding pad pattern, and a solder ball pad pattern.

As shown in FIG. 1f, the dry films 104a, 104b having the predetermined pattern are used as an etching resist, and the substrate 100 is dipped in an etchant, thereby etching portions of the upper and lower copper foils 102a, 102b and the copper plating layers 103a, 103b, which do not correspond in position to the predetermined pattern of the dry films 104a, 104b, to remove them.

As shown in FIG. 1g, the dry films 104a, 104b are stripped from upper and lower sides of the substrate 100, and are thus removed.

As shown in FIG. 1h, solder resists 105a, 105b are applied on the substrate 100, and then subjected to a pseudo-drying process.

As shown in FIG. 1i, the upper and lower solder resists 105a, 105b are exposed and developed to cure portions of the solder resists 105a, 105b, in areas corresponding to patterns of the solder resists. Subsequently, uncured portions of the solder resists are removed to pattern the solder resists 105a, 105b.

As shown in FIG. 1j, a gold plating layer 106a is formed on a wire bonding pad, which has a position corresponding to an opening (B) of the upper solder resist 105a of the substrate 100, and a gold plating layer 106b is formed on a solder ball pad, which has a position corresponding to an opening (C) of the lower solder resist 105b of the substrate 100.

FIG. 2 is a sectional view of a product, in which a semiconductor chip is mounted on a ball grid array board, fabricated according to the procedure of FIGS. 1a to 1j.

As shown in FIG. 2, after a semiconductor chip 220 is mounted using an adhesive 210 and a wire bond 230 and a solder ball 240 are formed, a molding 250 is formed, thereby creating the product in which the semiconductor chip is mounted on the ball grid array package substrate.

The fabrication of the ball grid array substrate as described above is disclosed in Korean Pat. No. 344,618, which was filed on Dec. 15, 1999 by the applicant of the present invention.

The above conventional technology has a disadvantage in that the package is thick.

Furthermore, the conventional technology is problematic in that since a thin core material is employed, investment is required to move the thin core material.

The conventional technology is also problematic in that a carrier is required to handle the thin material in a package assembly process.

FIG. 3 illustrates a product, in which a semiconductor chip is mounted on a ball grid array substrate, according to another embodiment of the conventional technology.

As shown in FIG. 3, after a cavity is formed through a substrate 300 in which circuit patterns 304 are formed on both sides of an insulator 301, a semiconductor chip 305 is mounted in the cavity. Subsequently, a wire bonding pad is connected to a semiconductor chip through wire bonds 303, and solder balls 302 are mounted on solder ball pads. Finally, the ball grid array substrate is packaged, thereby creating the product.

The fabrication of the ball grid array substrate as described above is disclosed in U.S. Pat. No. 5,696,666.

The above conventional technology is problematic in that heat, generated from the semiconductor chip 305, is emitted only through the wire bonds 303 but not through the insulator 301 having no thermal conductivity, thus heat radiation is low.

SUMMARY OF THE INVENTION

Therefore, the present invention has been made keeping in mind the above disadvantages occurring in the prior arts, and an object of the present invention is to provide a ball grid array substrate having a window, in which the window is formed on a core material instead of using a thin core material, and in which a semiconductor chip is mounted thereon, thereby reducing the thickness of a package, and a method of fabricating the same.

The above object of the present invention can be accomplished by providing a ball grid array substrate. The ball grid array substrate comprises a first external layer which includes first circuit patterns, wire bonding pad patterns, and a window corresponding in size to a first chip mounted therein and in which the chip is wire-bonded to the wire bonding pad patterns; a second external layer which includes second circuit patterns, a portion corresponding in position to the window of the first external layer, and solder ball pad patterns and in which second chips are mounted on the solder ball pad patterns; and an insulating layer which is interposed between the first and second external layers and through which the window is formed at a position corresponding to the window of the first external layer.

Furthermore, the present invention provides a method of fabricating a ball grid array substrate. The method includes the steps of (A) providing a substrate which includes a first external layer, a second external layer, and an insulating layer interposed between the first and second external layers; (B) forming a window through the first external layer and the insulating layer; (C) forming a first pattern, which includes first circuit and wire bonding pad patterns, on the first external layer, and forming a second pattern, which includes second circuit and solder ball pad patterns, on the second external layer; (D) forming a solder resist pattern which has openings corresponding to the wire bonding pad patterns and the solder ball pad patterns after solder resists are applied on the first and second external layers; and (E) gold plating the wire bonding pad patterns of the first external layer, the solder ball pad patterns of the second external layer, the window, and the second circuit patterns of the second external layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of the present invention with reference to the drawings.

Figure 1A:
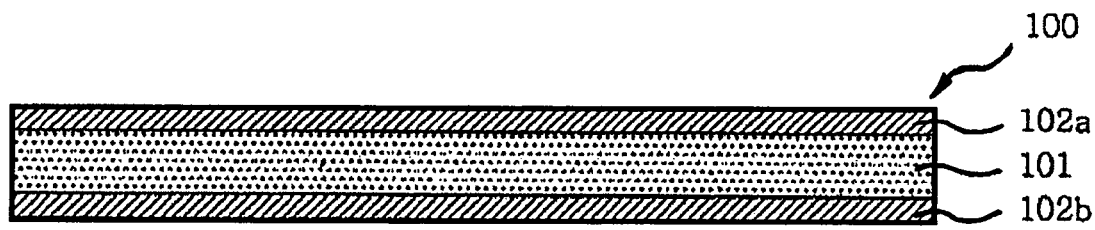
FIGS. 1*a* to 1*j* are sectional views illustrating the fabrication of a ball grid array substrate according to an embodiment of a conventional technology.
Figure 1B:
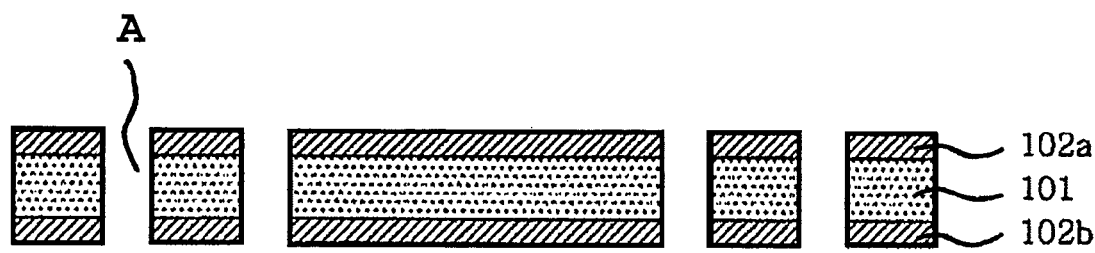
Figure 1C:
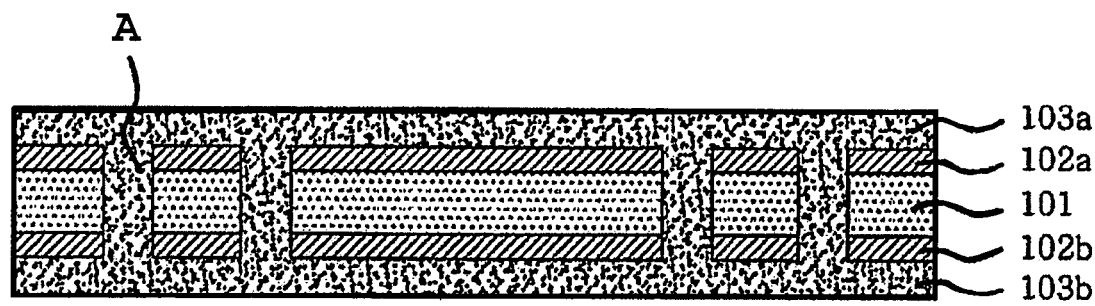
Figure 1D:
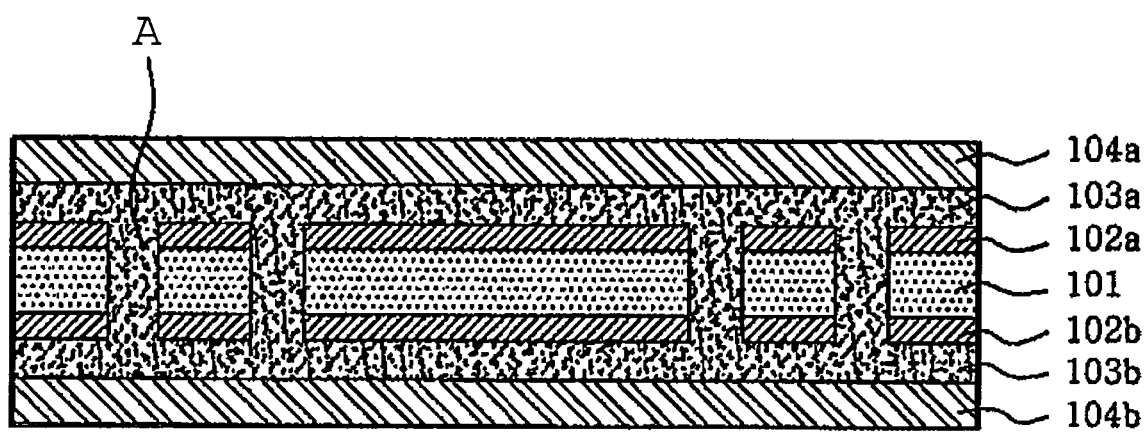
Figure 1E:
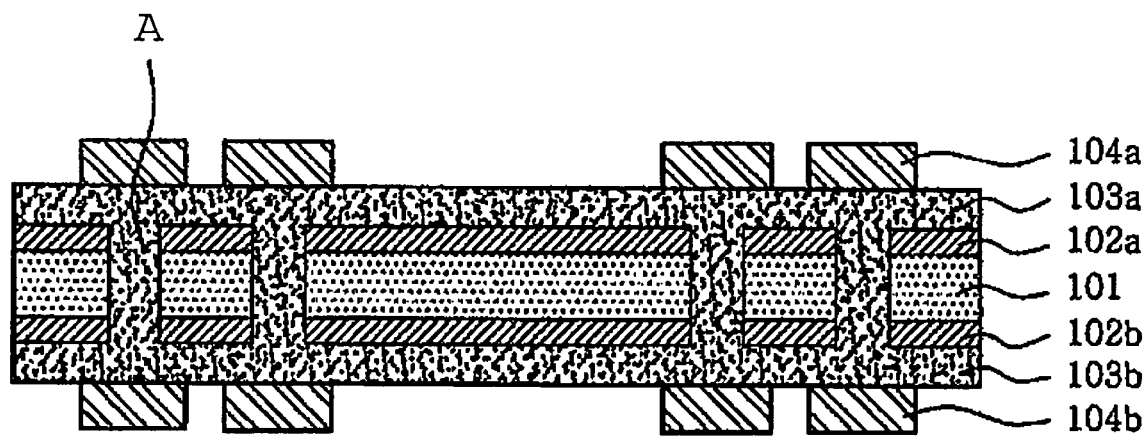
Figure 1F:
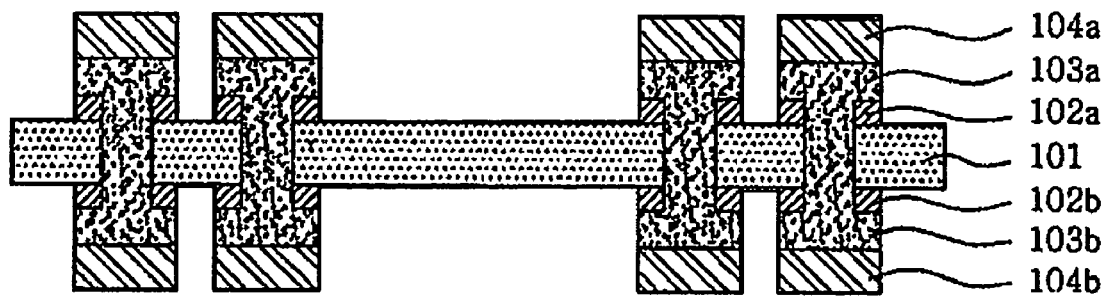
Figure 1G:
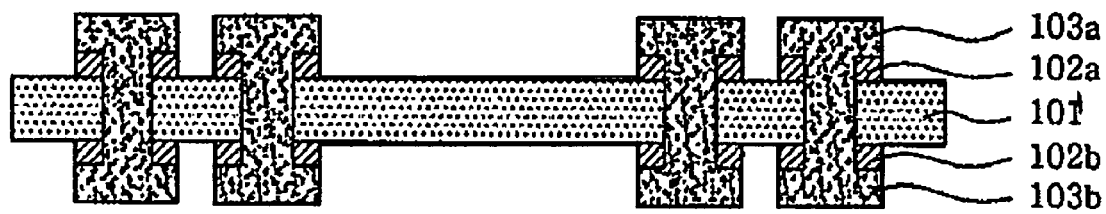
Figure 1H:
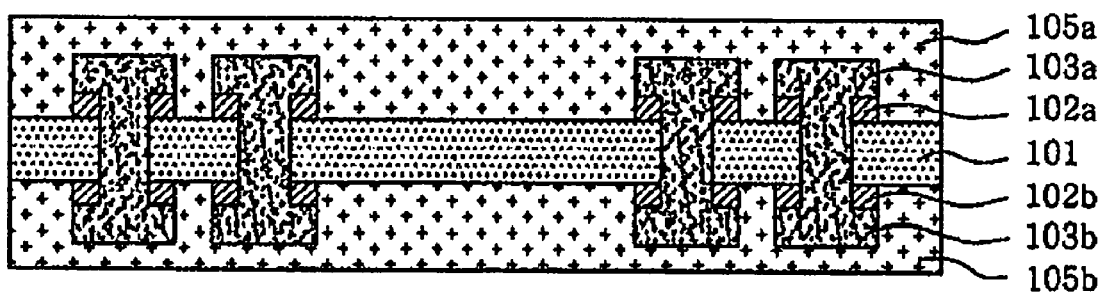
Figure 1I:
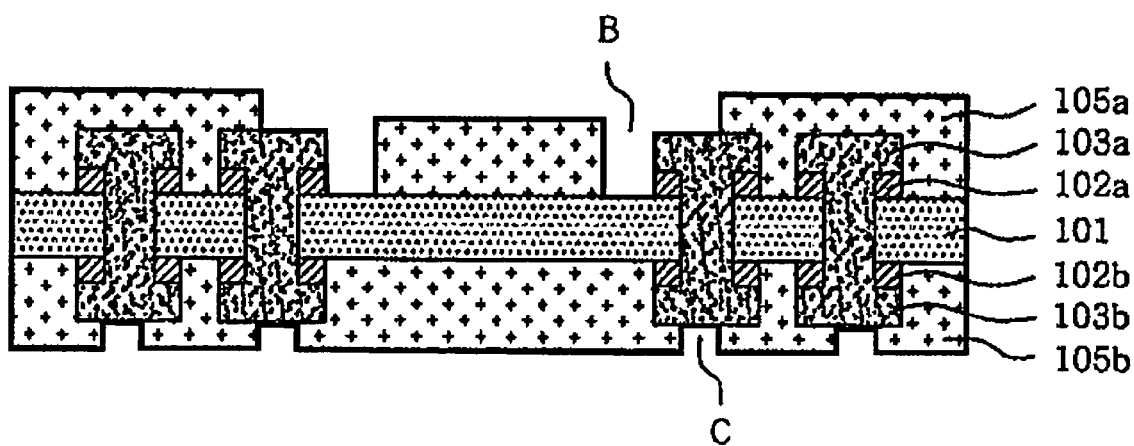
Figure 1J:
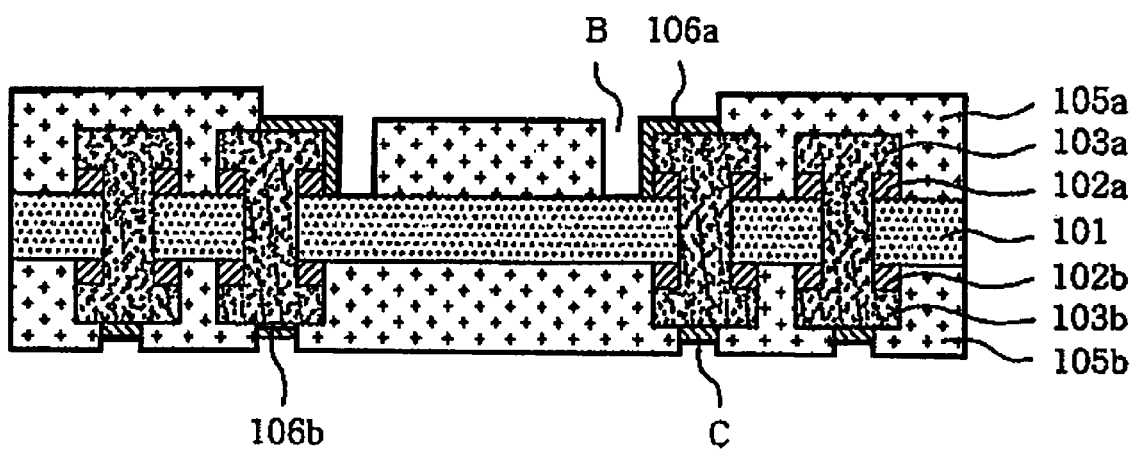
Figure 2:
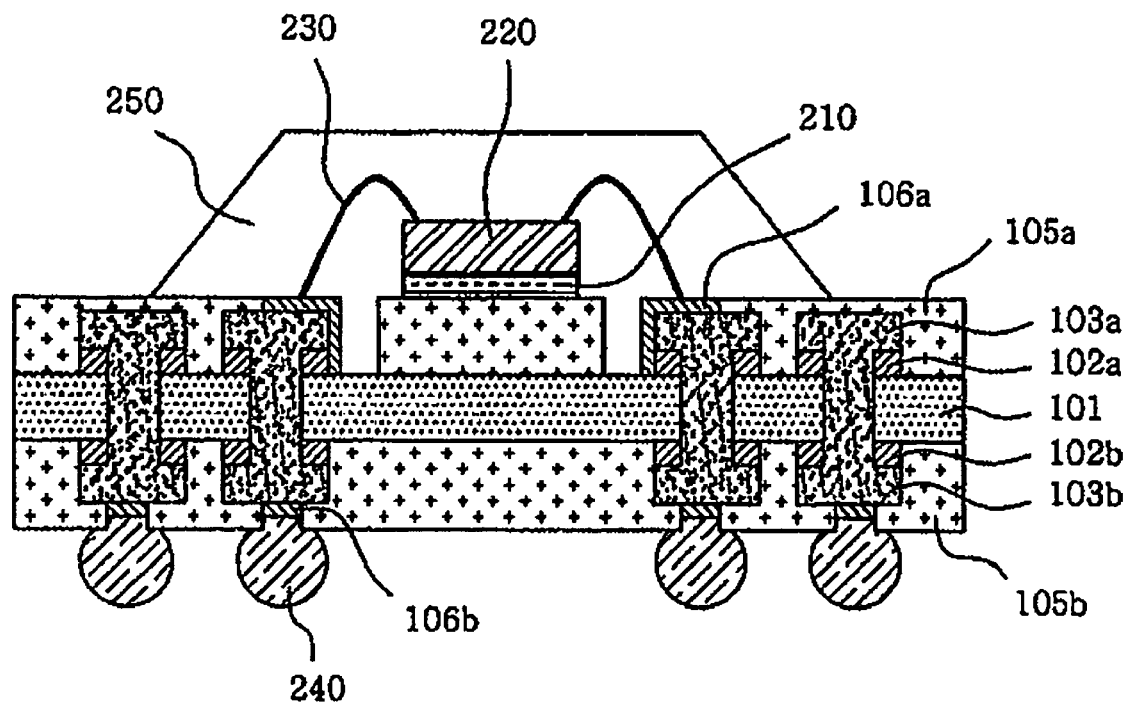
FIG. 2 is a sectional view of a product, in which a semiconductor chip is mounted on the ball grid array package substrate, fabricated according to the procedure of FIGS. 1*a* to 1*j*.
Figure 3:
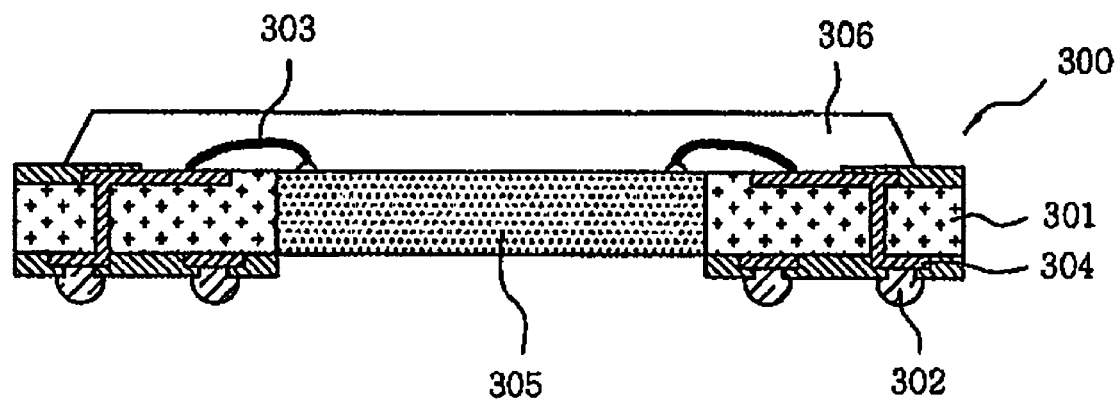
FIG. 3 illustrates a product, in which a semiconductor chip is mounted on a ball grid array substrate, according to another embodiment of the conventional technology.
Figure 4A:
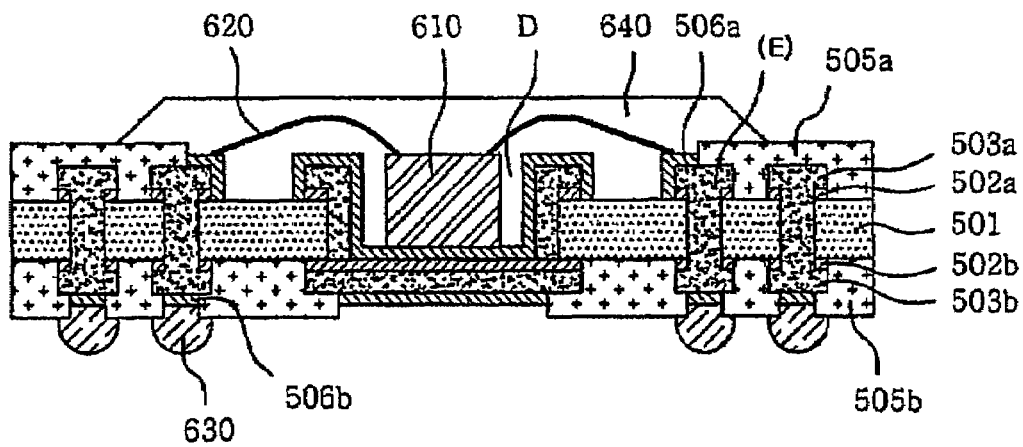
FIGS. 4*a* to 4*c* are sectional views of ball grid array substrates having a window according to the present invention.
Figure 4B:
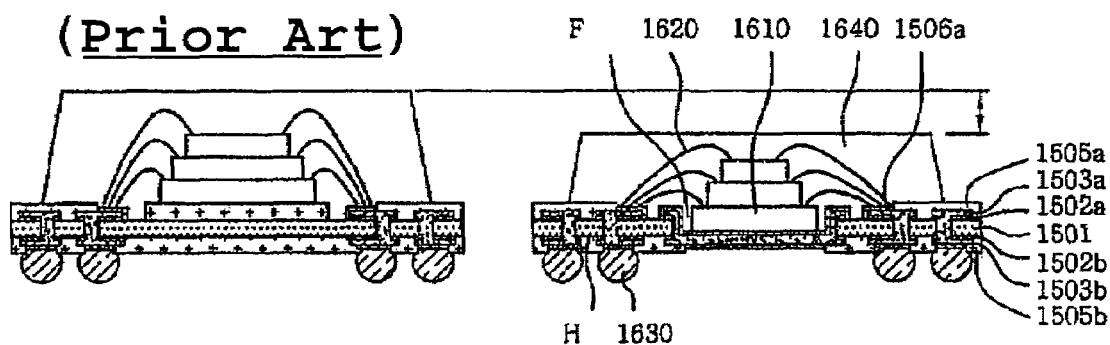
Figure 4C:
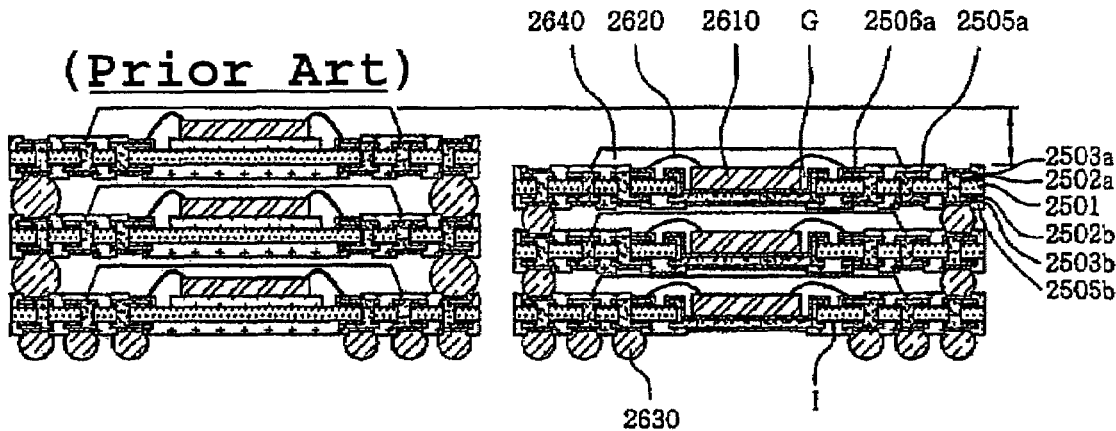

FIGS. 4*a* to 4*c* are sectional views of ball grid array substrates according to the present invention.

In FIG. 4*a*, the ball grid array substrate according to the present invention is provided with an insulating layer 501, and a via hole (E) for electrically connecting upper and lower sides of the insulating layer therethrough. Furthermore, the upper side of the insulating layer 501 includes a circuit pattern 503*a* and a wire bonding pad pattern, and the lower side of the insulating layer 501 includes a circuit pattern 503*b* and a solder ball pad pattern.

The ball grid array substrate is also provided with solder resist layers 505*a*, 505*b*, which are respectively formed on the upper and lower sides of the insulating layer 501 and which have openings at portions thereof corresponding in position to the wire bonding pad pattern and the solder ball pad pattern. The ball grid array substrate is further provided with a window pattern (D) in the insulating layer 501 and through the upper side of the insulating layer 501.

In this regard, the insulating layer 501 consists of a substrate 500 having no internal layer. However, the substrate having a multilayer structure, such as a 2-, 4-, 6-, or 8-layered structure, may be employed. The window (D) is formed using a punch, a drill bit, or the like.

Additionally, a gold plating layer 506*a* of a side wall of the window (D) is formed through electroless gold plating and electrolytic gold plating, a semiconductor chip 610 is directly mounted on the gold plating layer 506*a* of the window (D), and a gold plating layer 506*b* is laminated on the lower side of the insulating layer 501.

As well, the gold plating layer 506*b* of the side wall is formed through electroless gold plating and electrolytic gold plating, and the window (D) is formed to mount the semiconductor chip 610 therein, thereby reducing the thickness of the package. This structural characteristic serves to reduce the thickness of the package and to increase heat emission.

FIG. 4*b* illustrates a conventional substrate, and a multichip stack of a ball grid array substrate having a window according to the present invention.

The ball grid array substrate of the present invention is provided with an insulating layer 1501, and via holes (H) for electrically connecting upper and lower sides of the insulating layer therethrough. Furthermore, the upper side of the insulating layer 1501 includes a circuit pattern 1503*a* and a wire bonding pad pattern, and the lower side of the insulating layer 1501 includes a circuit pattern 1503*b* and a solder ball pad pattern.

The ball grid array substrate is also provided with solder resist layers 1505*a*, 1505*b*, which are respectively formed on the upper and lower sides of the insulating layer 1501 and which have openings at portions thereof corresponding in position to the wire bonding pad pattern and the solder ball pad pattern. The ball grid array substrate is further provided with a window pattern (F) in the insulating layer 1501 and through the upper side of the insulating layer 1501.

As well, a plurality of semiconductor chips 1610 is mounted on the window (F).

After the ball grid array substrate is formed, the plurality of semiconductor chips 1610 is mounted on a gold plating layer 1506a formed on the window pattern (F) using an adhesive so as to form the multi-chip stack. The semiconductor chips 1610 are connected through wire bonds 1620 to wire bonding pads.

Heat generated from the semiconductor chips 1610 is emitted through the wire bonds 1620, the gold plating layer 1506a on the window pattern (F), and the gold plating layer 1506b on the lower side of the insulating resin layer 1501.

The above structural characteristic serves to reduce a thickness of a package and to increase heat emission.

FIG. 4c illustrates a conventional substrate, and a multi-package stack of ball grid array substrates having a window (G) according to the present invention.

The ball grid array substrate of the present invention is provided with an insulating layer 2501, and via holes (I) for electrically connecting upper and lower sides of the insulating layer therethrough. Furthermore, the upper side of the insulating layer 2501 includes a circuit pattern 2503a and a wire bonding pad pattern, and the lower side of the insulating layer 2501 includes a circuit pattern 2503b and a solder ball pad pattern.

The ball grid array substrate is also provided with solder resist layers 2505a, 2505b, which are respectively formed on the upper and lower sides of the insulating layer 2501 and which have openings at portions thereof corresponding in position to the wire bonding pad pattern and the solder ball pad pattern. The ball grid array substrate is further provided with the window pattern (G) in the insulating layer 2501 and through the upper side of the insulating layer 2501.

Furthermore, an additional plurality of substrates is laminated on the above substrate.

In this case, the three ball grid array substrates are formed, and then laminated. The first substrate includes a plurality of solder balls 2630, and the second and third substrates are connected to the solder balls 2630 and the gold plating layers 2506a formed on circuit patterns 2503a on the upper side of the insulating layer 2501. This structural characteristic serves to reduce the thickness of a package and to increase heat emission.

Furthermore, when the substrate is packaged, moldings 2640 each have a thickness that is smaller than the diameter of each of the solder balls 2630. The multi-package stack is formed as described above to create high density Chip Size Package (CSP) goods.

FIGS. 5a to 5m are sectional views illustrating the fabrication of a ball grid array substrate having a window according to the present invention.

Figure 5A:
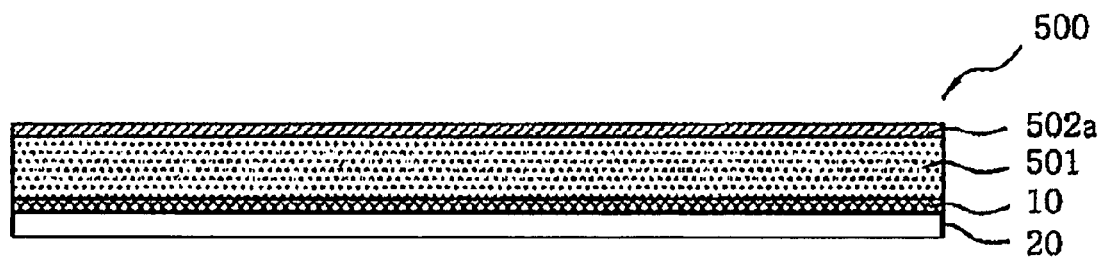
FIGS. 5*a* to 5*m* are sectional views illustrating the fabrication of the ball grid array substrate having the window according to the present invention.

As shown in FIG. 5a, a copper clad laminate as a substrate 500, in which a copper foil 502 is laminated on an upper side of an insulating resin layer 501 and a protective film 20 is mounted on a lower side of the insulating resin layer using an adhesive 10, is prepared.

In this regard, the copper clad laminate may be classified into a glass/epoxy copper clad laminate, a heat-resistant resin copper clad laminate, a paper/phenol copper clad laminate, a high-frequency copper clad laminate, a flexible copper clad laminate (polyimide film), or a composite copper clad laminate, depending on the application. However, the glass/epoxy copper clad laminate is frequently adopted in the course of fabricating double-sided and multilayer PCBs.

In this case, the substrate 500 does not have an internal layer, but a substrate having a plurality of internal layers, such as 2, 4, or 6 internal layers, may be used depending on the purpose or the application.

Figure 5B:
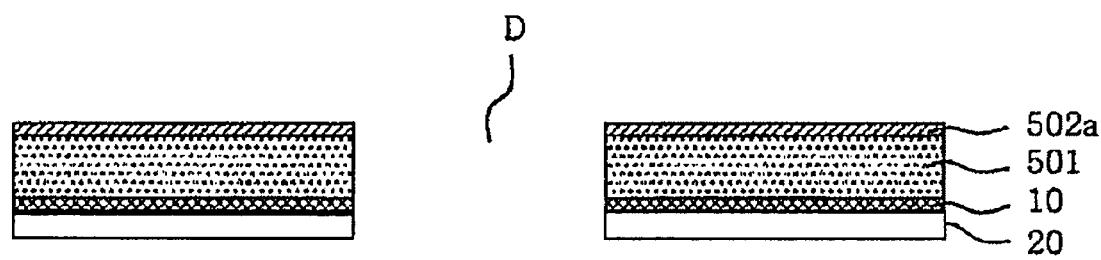

Next, as shown in FIG. 5b, a window (D) is formed.

At this stage, the window (D) is formed using a punch or a drill bit.

Figure 5C:
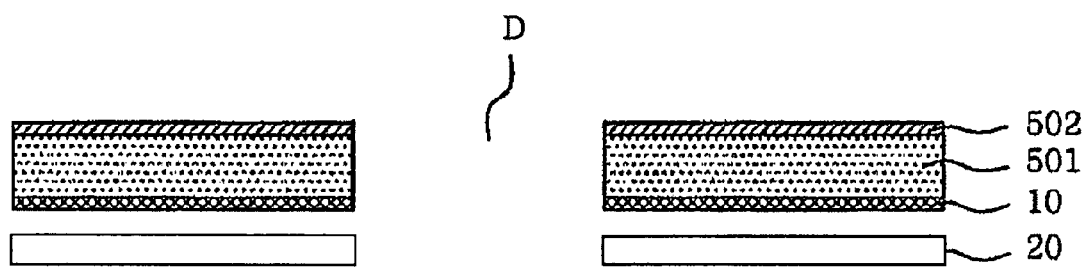

Subsequently, as shown in FIG. 5c, the protective film 20 for protecting the adhesive 10 is removed.

Figure 5D:
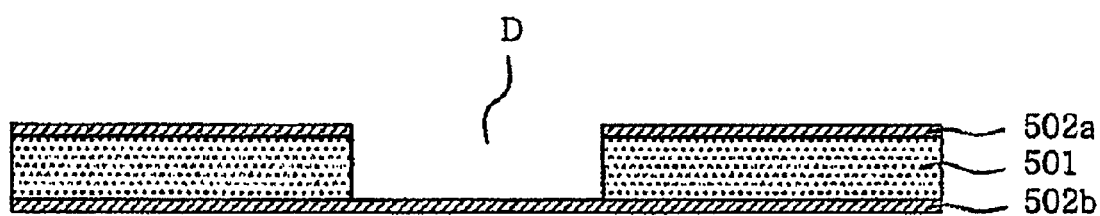

Next, as shown in FIG. 5d, a copper foil 502b is attached to the adhesive 10.

Hereinafter, the adhesive is not shown in the drawings.

Figure 5E:
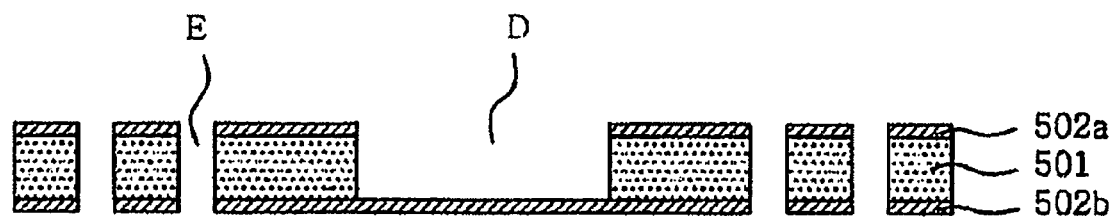

Thereafter, as shown in FIG. 5e, via holes (E) are formed to electrically connect upper and lower sides of the copper clad laminate as internal core material to each other.

It is preferable that the via holes (E) be formed at predetermined positions using a CNC drill (computer numerical control drill) or a laser drill.

The use of the CNC drill is suitable to form a via hole of a double-sided PCB or a through hole of a multilayer PCB. After the via holes (E) are formed using the CNC drill, it is preferable that a deburring process be conducted to remove burrs, generated during the drilling process, from copper foils 502a, 502b, and dust adhering to walls of the via holes (E) and to surfaces of the copper foils 502a, 502b. At this time, the surfaces of the copper foils 502a, 502b become rough, thus improving the adhesion strength of copper to the copper foils in a subsequent copper plating process.

The use of the laser is suitable to form a micro-via hole through a multilayer PCB. In this regard, it is possible to simultaneously process the copper foils 502a, 502b and the insulating layer 501 using a YAG laser (yttrium aluminum garnet laser), or it is possible to process the insulting layer 501 using a carbon dioxide laser ($CO_2$ laser) after a portion of the copper foils 502a, 502b, through which the via holes (E) are to be formed, is etched.

Meanwhile, after formation of the via holes (E), it is preferable to conduct a desmear process so as to remove a smear which is formed on the walls of the via holes (E) by melting the insulating layer 501 due to heat generated in the course of forming the via holes.

Figure 5F:
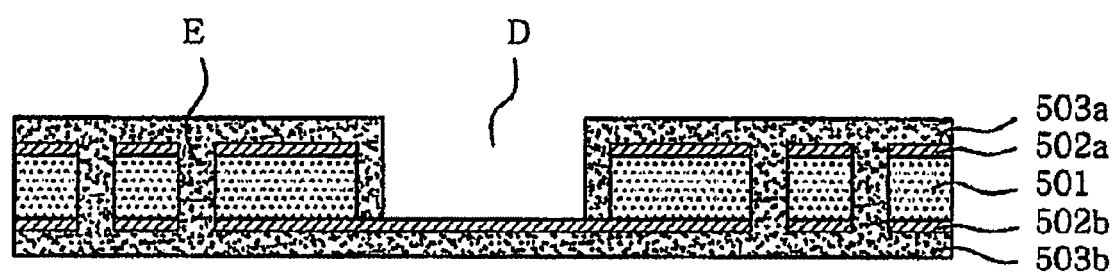

Subsequently, as shown in FIG. 5f, a surface of the substrate 500, the walls of the via holes (E), and a wall of the window (D) are subjected to electroless plating and electrolytic plating processes to form copper plating layers 503a, 503b for electric connection.

Since the walls of the via holes (E) of the substrate 500 each include the insulating resin layer 501, it is impossible to conduct the electrolytic copper plating process immediately after the via holes (E) are formed.

Accordingly, the electroless copper plating process is carried out so as to electrically connect the via holes (E) to each other and to make the electrolytic copper plating process possible. Since the electroless copper plating process is a process of plating an insulator, it is difficult to expect a reaction caused by ions with electricity. The electroless copper plating process is achieved by a deposition reaction, and the deposition reaction is promoted by a catalyst. The catalyst must be attached to a surface of a material to be plated, so as to separate copper from a plating solution to deposit copper on the material. This means that the electroless copper plating process requires many pre-treating steps.

For example, the electroless copper plating process may include a degreasing step, a soft etching step, a pre-catalyst treating step, a catalyst treating step, an acceleration step, an electroless copper plating step, and an anti-oxidizing step.

In the degreasing step, oxides, impurities, and, particularly, oils and fats are removed from surfaces of the upper and lower copper foils 502a, 502b using a chemical containing acid or alkaline surfactants, and the resulting copper foils are rinsed to completely remove the surfactants therefrom.

The soft etching step makes the surfaces of the upper and lower copper foils 502a, 502b slightly rough (for example, a roughness of about 1–2 μm) so as to uniformly deposit copper particles on the copper foils during the plating process, and contaminants which were not removed during the degreasing step are removed from the copper foils.

In the pre-catalyst treating step, the substrate 500 is dipped in a dilute first catalyst-containing chemical solution to prevent a second catalyst-containing chemical solution, used in the catalyst treating step, from becoming contaminated, and to prevent the concentration of the second catalyst-containing chemical solution from changing. Moreover, because the substrate 500 is preliminarily dipped in the first chemical solution, having the same components as the second chemical solution, prior to treating the substrate using the second chemical solution, the treatment of the substrate using the catalyst is more effectively achieved. At this time, it is preferable that a 1–3% chemical concentration be used in the pre-catalyst treating step.

In the catalyst treating step, catalyst particles are applied to the copper foils 502a, 502b and the insulating resin layer 501 (i.e. the walls of the via holes (E)) of the substrate 500. The catalyst particles may be preferably exemplified by a Pd—Sn compound, and $Pd^{2-}$ dissociated from the Pd—Sn compound promotes the plating of the substrate in conjunction with $Cu^{2+}$ plated on the substrate.

During the electroless copper plating step, it is preferable that a plating solution contain $CuSO_4$, HCHO, NaOH, and a stabilizer. It is important to control the composition of the plating solution because chemical reactions constituting the plating process of the substrate must maintain an equilibrium state in order to continuously conduct the plating process. To desirably maintain the composition of the plating solution, it is necessary to properly replenish each component constituting the plating solution, to mechanically agitate the plating solution, and to smoothly operate a cycling system of the plating solution. Furthermore, it is necessary to use a filtering device to remove byproducts resulting from the reaction, and the removal of the byproducts using the filtering device helps extend the life of the plating solution.

An anti-oxidizing layer is layered on the copper foils to prevent oxidation of the copper foils by alkaline components remaining after the electroless copper plating step during the anti-oxidizing step.

However, since an electroless copper-plating layer usually has poorer physical properties than an electrolytic copper-plating layer, the electroless copper-plating layer is thinly formed.

Alternatively, the formation of the electroless copper plating layer may be achieved through a sputtering process, in which gas ion particles (for example, $Ar^+$), generated by a plasma or the like, collide with a copper target to form the electroless copper plating layers on the insulating layer 501, the walls and lands of the via holes (E).

After the completion of the electroless copper plating process, the substrate 500 is dipped into a copper plating tub, and the electrolytic copper plating process is then conducted using a D.C. rectifier. Preferably, the electrolytic copper plating process is conducted in such a way that after an area to be plated is calculated, a proper amount of electricity is applied to the D.C. rectifier to achieve the deposition of copper.

The electrolytic copper plating process is advantageous in that physical properties of the electrolytic copper plating layer are superior to those of the electroless copper plating layer and it is easy to form a thick copper plating layer.

Figure 5G:
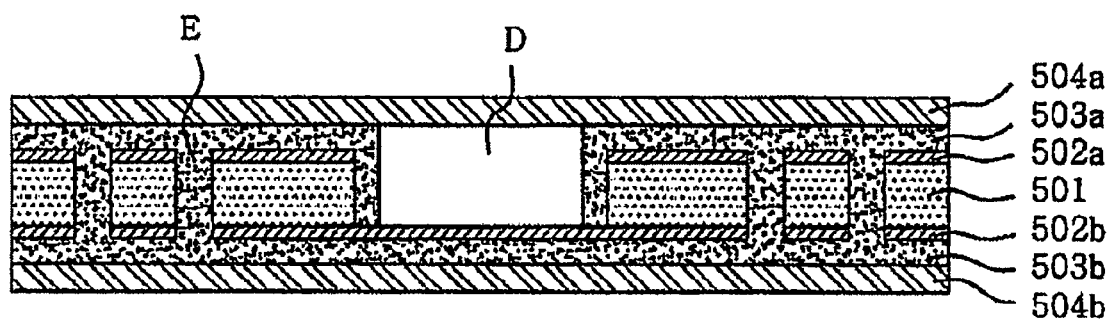

Next, as shown in FIG. 5g, dry films 504a, 504b are applied on the upper and lower copper plating layers 503a, 503b of the substrate 500.

Each of the dry films 504a, 504b consists of three films: a cover film, a photo-resist film, and a Mylar film. Of the three films, the photo-resist film substantially acts as a resist layer.

The dry films 504a, 504b having a predetermined pattern printed thereon are then exposed and developed to be patterned.

The pattern includes a circuit pattern, lands of the via holes (E), a wire bonding pad pattern, a solder ball pad pattern, and a window pattern.

After artwork films having a predetermined pattern printed thereon are mounted on the dry films 504a, 504b, ultraviolet rays are irradiated to expose and develop the dry films 504a, 504b. At this stage, ultraviolet rays do not penetrate a black portion of each artwork film, which corresponds to the pattern, but penetrate the remaining portion of the artwork film, on which the pattern is not printed, to cure the dry films under the artwork films. The substrate, on which the cured dry films 504a, 504b are mounted, is dipped in a developing solution to remove an uncured portion of the dry films 504a, 504b. In this regard, the remaining cured portion of the dry films 504a, 504b forms an etching resist pattern. With respect to this, examples of the developing solution include a sodium carbonate ($Na_2CO_3$) aqueous solution and a potassium carbonate ($K_2CO_3$) aqueous solution.

Figure 5H:
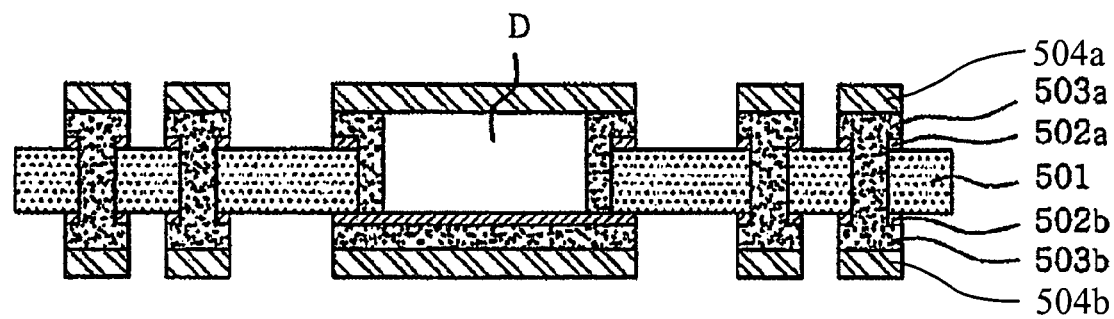

As shown in FIG. 5h, the patterned dry films 504a, 504b are used as an etching resist, and an etchant is sprayed on the substrate 500 to etch portions of the upper and lower copper foils 502a, 502b and the copper plating layers 503a, 503b, which do not correspond in position to the pattern of the dry films, and thus remove them.

Figure 5I:
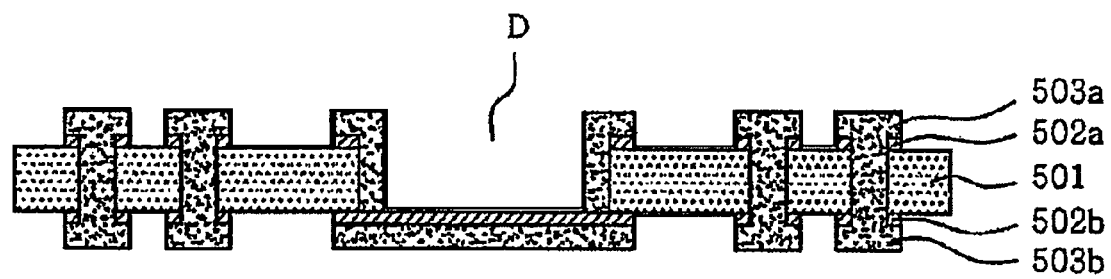

Subsequently, as shown in FIG. 5i, the dry films 504a, 504b are stripped from the upper and lower sides of the substrate 500 and are thus removed.

A stripping solution, such as sodium hydroxide (NaOH) or potassium hydroxide (KOH), is used to remove the dry films 504a, 504b.

In the procedure of FIGS. 5g to 5i, the dry films 504a, 504b are used as the etching resist, but alternatively a photosensitive liquid may be used as the etching resist.

In case that the photosensitive liquid is used as the etching resist, the photosensitive liquid, which is to be exposed to ultraviolet rays, is applied on the copper plating layers 503a, 503b on the substrate 110, and then dried. Subsequently, a dried photosensitive material is exposed and developed, using the patterned artwork films, to be patterned. Next, the patterned photosensitive material is used as the etching resist, and the etchant is sprayed on the substrate 500 to etch portions of the upper and lower copper foils 502a, 502b and the copper plating layers 503a, 503b, which do not correspond in position to the pattern of the photosensitive material, and thus remove them. Subsequently, the photosensitive material is removed. Examples of an application process for the photosensitive liquid include a dip coating process, a roll coating process, and an electro-deposition process.

Compared to the use of the dry films 504a, 504b, the use of the photosensitive liquid can bring about formation of a thinner layer, and thus, it is advantageous in that it is possible to form a finer circuit pattern. Another advantage is that when the surface of the substrate 500 is uneven, it is possible to make the surface flat.

Figure 5J:
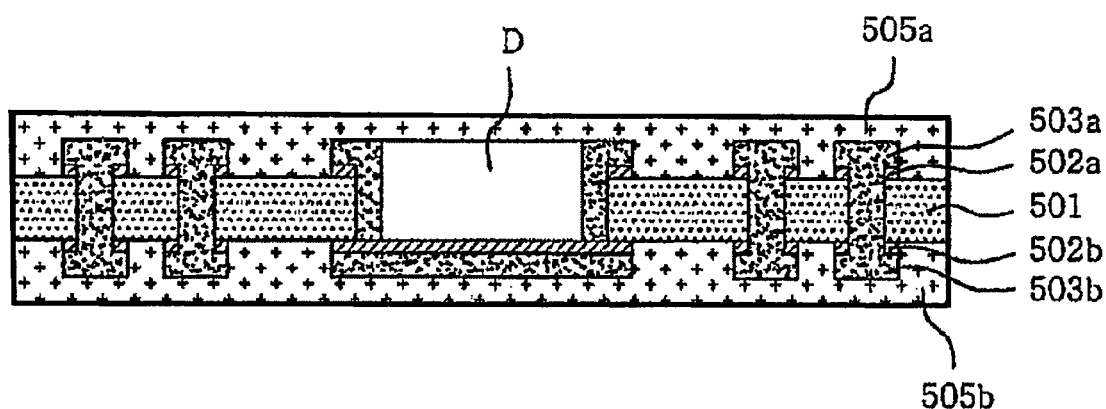

Next, as shown in FIG. 5j, solder resists 505a, 505b are applied and then subjected to a pseudo-drying process.

If the substrate 500, in which the circuit patterns are formed on the copper foils 502a, 502b and the copper plating layers 503a, 503b, is smeared with finger marks, oil, and dust, the solder resists 505a, 505b may not completely adhere to the substrate 500. Therefore, before the solder resists 505a, 505b are applied, it is preferable that the surface of the substrate be washed and pretreatments be conducted to make the surface of the substrate uneven so as to improve the adhesion strength between the solder resists 505a, 505b and the substrate 500.

Examples of an application process for the solder resists 505a, 505b include a screen printing process, a roller coating process, a curtain coating process, and a spray coating process.

The screen printing process is a process where a solder resist pattern is directly printed. In the roller coating process, a solder resist ink, which has a viscosity that is lower than that used in the screen printing process, is thinly applied on a rubber roller and then layered on the substrate.

Furthermore, in the curtain coating process, a solder resist ink, which has a viscosity that is lower than that used in the roller coating process, is employed. The spray coating process is a process where a resist ink is sprayed to achieve coating.

After artwork films having a solder resist pattern printed thereon are mounted on the upper and lower solder resists 505a, 505b of the substrate 500, the solder resists 505a, 505b are exposed and developed to cure portions of the solder resists 505a, 505b, which correspond in position to the solder resist pattern.

In the exposure process, ultraviolet rays do not penetrate the black portion of each artwork film, on which the solder resist pattern is printed, but penetrate the remaining portion of the artwork film, on which the pattern is not printed, to cure the solder resists 505a, 505b.

Figure 5K:
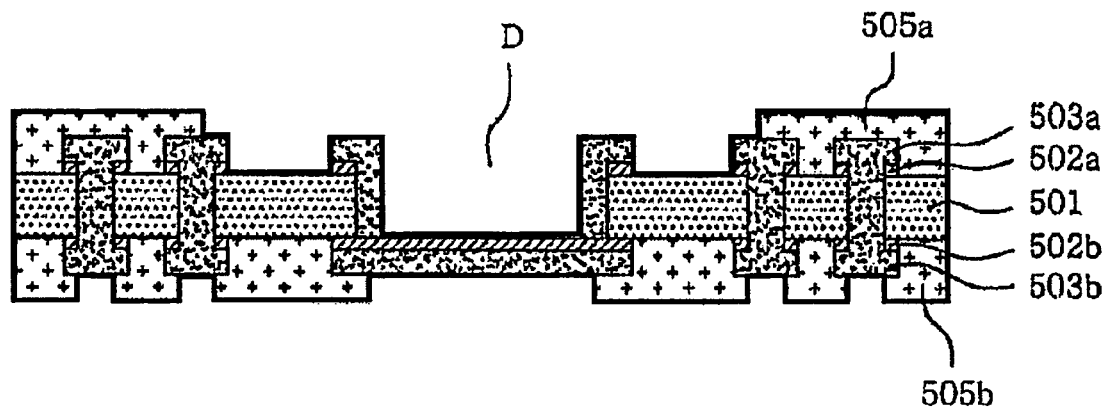

Subsequently, as shown in FIG. 5k, after the artwork films are removed, uncured portions of the solder resists 505a, 505b are removed in the development process to pattern the solder resists. Ultraviolet rays are irradiated to cure the solder resists, and the solder resists 505a, 505b are completely cured using a drier (not shown).

After the solder resists 505a, 505b are removed from the substrate 500, it is preferable to further conduct a process, in which residuals of the solder resists 505a, 505b and impurities are removed using a plasma.

Figure 5L:
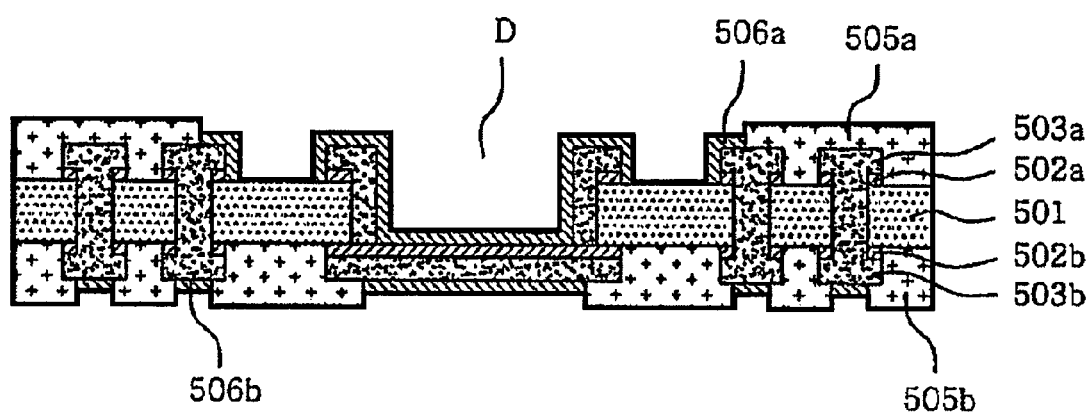

Subsequently, as shown in FIG. 5l, gold plating layers 506a, 506b are formed on a solder ball pad pattern, a wire bonding pad pattern, a window pattern, and a lower pattern of the substrate 500.

Thereafter, it is impossible to conduct an electrolytic gold plating process immediately because the substrate 500 partially consists of the insulating resin layer 501.

Accordingly, an electroless gold plating process is carried out so as to achieve electric connection of the insulating resin layer 501 and to achieve the electrolytic gold plating process. Since the electroless gold plating process is a process of plating an insulator, it is difficult to expect a reaction caused by ions with electricity.

For example, the formation of an electroless gold plating layer may be achieved through a sputtering process, in which gas ion particles (for example, $Ar^+$), caused by a plasma or the like, collide with a gold target to form the electroless gold plating layers on the insulating layer 501 and the window.

After the completion of the electroless gold plating process, the substrate 500 is dipped into a gold plating tub, and the electrolytic gold plating process is then conducted using a D.C. rectifier to form the gold plating layers 506a, 506b. Preferably, the electrolytic gold plating process is conducted in such a way that after an area to be plated is calculated, a proper amount of electricity is applied to the D.C. rectifier to achieve the deposition of gold.

Additionally, in order to improve adhesion strength to gold, it is preferable to form the gold plating layers 506a, 506b after nickel is thinly plated.

Figure 5M:
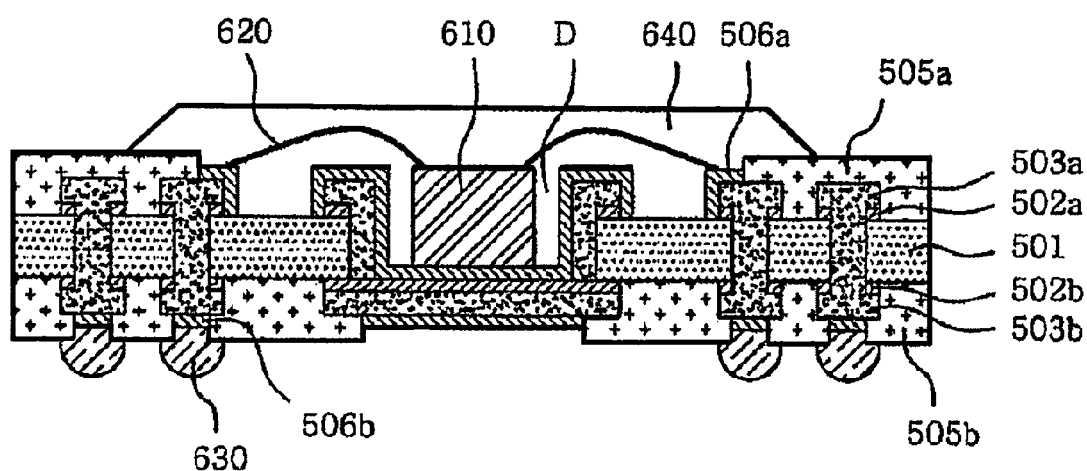

As shown in FIG. 5m, an exterior structure of the substrate is then constructed using a router or a power press.

Next, after a semiconductor chip 610 is mounted and a wire bond 620 and a solder ball 630 are formed, a molding 640 is formed, thereby creating the ball grid array substrate having the window.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, a ball grid array substrate having a window according to the present invention is advantageous in that the window is formed to mount a semiconductor chip therein, thereby reducing the thickness of the package.

Another advantage of the ball grid array substrate according to the present invention is that since a thin core board is not needed, it is unnecessary to invest in novel equipment in order to move the thin core board.

Still another advantage of the ball grid array substrate according to the present invention is that it is possible to implement a package assembly process without a carrier used to handle the thin board.

A further advantage of the ball grid array substrate according to the present invention is that a metal heat emission area increases due to side wall plating.

What is claimed is:

1. A ball grid array substrate, comprising:
   a first external layer which includes first circuit patterns, wire bonding pad patterns, and a window corresponding in size to a first chip mounted therein and where in the chip is wire-bonded to the wire bonding pad patterns;
   a second external layer which includes second circuit patterns, a portion corresponding in position to the window of the first external layer, and solder ball pad patterns and wherein second chips are mounted on the solder ball pad patterns;
   an insulating layer interposed between the first and second external layers and a window of the insulating layer is formed at a position corresponding to the window of the first external layer; and
   a gold plating layer formed on a bottom of the window of the insulating layer.

2. The ball grid array substrate as set forth in claim 1, wherein a plurality of semiconductor chips is mounted in the window of the insulating layer.

3. The ball grid array substrate as set forth in claim 1, wherein the ball grid array substrate is laminated together with a plurality of other substrates.

4. The ball grid array substrate as set forth in claim 1, further comprising a first plating layer formed on the wire bonding pad patterns, on the solder ball pad patterns, on a wall of the window, and on the second circuit patterns of the second external layer.

5. The ball grid array substrate as set forth in claim 4, further comprising a second plating layer formed between the wire bonding pad patterns and the gold plating layer, between the solder ball pad patterns and the gold plating layer, between the window and the gold plating layer.

6. The ball grid array substrate as set forth in claim 4, wherein the gold plating layer is formed on the first plating layer.

7. The ball grid array substrate as set forth in claim 1, wherein the gold plating layer is formed on the wire bonding pad panels of the first external layer, the solder ball pad patterns of the second external layer, walls of the window of the insulating layer, and the second circuit patterns of the second external layer.

* * * * *